(12) United States Patent
Okayama et al.

(10) Patent No.: US 7,989,359 B2
(45) Date of Patent: Aug. 2, 2011

(54) SEMICONDUCTOR MODULE MANUFACTURING METHOD, SEMICONDUCTOR MODULE, AND MOBILE DEVICE

(75) Inventors: Yoshio Okayama, Gifu (JP); Yasuyuki Yanase, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 592 days.

(21) Appl. No.: 12/022,812

(22) Filed: Jan. 30, 2008

(65) Prior Publication Data

US 2008/0284012 A1    Nov. 20, 2008

(30) Foreign Application Priority Data

Jan. 31, 2007  (JP) .................. 2007-020657
Jan. 23, 2008  (JP) .................. 2008-012240

(51) Int. Cl.
*H01L 21/31* (2006.01)
(52) U.S. Cl. ........................................ 438/773
(58) Field of Classification Search .................. None
See application file for complete search history.

(56) References Cited

U.S. PATENT DOCUMENTS 5,821,627 A * 10/1998 Mori et al. ............... 257/780
2004/0134682 A1* 7/2004 En et al. ................. 174/258
2009/0250251 A1* 10/2009 Shibata et al. ............. 174/255

FOREIGN PATENT DOCUMENTS

| JP | 09-289264 | 11/1997 |
| JP | 2000-068641 | 3/2000 |
| WO | WO/2007/063954 | 6/2007 |

* cited by examiner

*Primary Examiner* — Charles D Garber
*Assistant Examiner* — Andre' C Stevenson
(74) *Attorney, Agent, or Firm* — Fish & Richardson P.C.

(57) ABSTRACT

A semiconductor substrate having on its surface an electrode of a semiconductor device and a pattern unit is prepared. A copper plate is formed provided with a first principle surface having a bump and a second principle surface, opposite to the first principle surface, having a trench. By adjusting the position of the copper plate so that a pattern unit and the corresponding trench have a predetermined positional relation, the bump and the electrode are aligned, the first principle surface of the copper plate and a semiconductor substrate are pressure-bonded via an insulating layer, and the bump and the electrode become connected electrically while the bump penetrating the insulating layer. A predetermined rewiring pattern is formed on the side of the second principle surface.

12 Claims, 13 Drawing Sheets

SEMICONDUCTOR MODULE MANUFACTURING METHOD, SEMICONDUCTOR MODULE, AND MOBILE DEVICE

CROSS-REFERENCE TO RELATED APPLICATIONS

This application is based upon and claims the benefit of priority from the prior Japanese Patent Applications No. 2007-020657, filed Jan. 31, 2007, and Japanese Patent Application No. 2008-012240, filed Jan. 23, 2008, the entire contents of which are incorporated herein by reference.

BACKGROUND OF THE INVENTION

1. Field of the Invention

The present invention relates to semiconductor module manufacturing methods, semiconductor modules, and mobile devices.

2. Description of the Related Art

Recently, with the trend toward miniaturization and high performance of electronic devices, there is a demand for further reduction of the size of semiconductor devices (semiconductor modules) used in electronic devices. With the trend toward miniaturization of the semiconductor devices, narrow-gap electrodes have become essential to be mounted on wiring substrates. As a surface mounting method of the semiconductor devices, a flip chip method is known which produces solder bumps on the electrodes of the semiconductor devices and solders the solder bumps and electrode pads of the wiring substrates. However, in the flip chip method, efforts for size reduction by narrowing the gap between electrodes have been successful only to a limited degree due to the constraints imposed by the size of solder bumps and solder bridges produced. To overcome the limitation, a metal plate may be half-etched so that a resultant bump structure is used as an electrode or a via, a semiconductor device may be mounted on the metal plate via an insulating layer of, for example, epoxy resin, and the electrode of the semiconductor device may be connected to the bump structure.

The alignment of a bump structure and an electrode of the semiconductor device is necessary for the embedding of the bump structure in the insulating layer, the lamination of a metal plate, an insulating layer, and a semiconductor device, and the integration. In the conventional manufacturing technology, a through hole for alignment is formed on the metal plate with a drill, and the bump structure of the metal plate and the electrode for the semiconductor device are aligned in accordance with the through hole of the metal plate and an alignment mark on the semiconductor device exposed through the hole. And, in the processing of the metal plate into a predetermined wiring pattern by lithography and etching, the through hole is also used for the alignment. However, the improvement of the accuracy of the alignment is challenging due to the scaling limit of the drill processing and its poor processing accuracy; and thus, the cost lowering in relation with the microfabrication of the semiconductor device (semiconductor module) as a result of the reduction in the manufacturing margin (alignment margin) comes with difficulty. Also, the drill processing itself adds the extra processing steps and has been one of the factors for the increased manufacturing cost of the semiconductor device (semiconductor module).

SUMMARY OF THE INVENTION

In this background, a general purpose of the present invention is to improve the accuracy of the alignment for the connection of the bump structure of the metal plate and the electrode of the semiconductor device while the bump structure and the electrode facing to each other, and to provide a technology capable of lowering the manufacturing cost of the semiconductor module.

An aspect of the present invention, in order to solve the above mentioned problems, relates to a method of manufacturing a semiconductor module. The method of manufacturing a semiconductor module comprises: 1) preparing a substrate having a semiconductor device, an electrode connected electrically to the semiconductor device, and a predetermined first pattern unit on its surface; 2) preparing a metal plate having a first principle surface having a bump projecting from the surface and a second principle surface, opposite to the first principle surface, having a trench unit having a predetermined pattern; 3) aligning the bump and the electrode by adjusting the position of the metal plate so that the first pattern unit and a corresponding trench have a predetermined positional relation, pressure-bonding the first principle surface of the metal plate and the substrate via the insulating layer, and connecting the bump and the electrode electrically while the bump penetrates an insulating layer; and 4) forming a wiring layer having a predetermined pattern on the second principle surface of the metal plate.

In the above structure, the metal plate may be processed into a wiring layer having a predetermined pattern by performing etch-back on the second principle surface of the metal plate so that a bottom part of the trench is penetrated to the first principle surface in step 4).

In the above structure, the metal plate may be processed so that the region between the sides of the wiring layer and the principle surface of the wiring layer on the opposite side of the insulating layer are chamfered in step 4).

In the above structure, step 2) may comprise process 1) of forming the bump on one side of a flat metal plate and process 2) of forming the trench on the other side of the flat metal plate using a second predetermined pattern unit of the bump as a reference.

In the above structure, the plurality of semiconductor devices may be formed on the substrate, and the trench may be further formed in a scribe region formed to section the plurality of semiconductor devices.

In the above structure, the first principle surface of the metal plate and the substrate may be pressure-bonded while adding a heat in step 3), and process 1) may comprise forming the bump at the position displaced in a direction opposite to the expansion of the metal plate from the position where the bump faces the electrode in accordance with a difference in the coefficients of thermal expansion of the metal plate and the substrate, a heating temperature in step 3), and a distance from the reference point of the metal plate which is not moved by the expansion caused due to the heating in step 3).

Another aspect of the present invention relates to a semiconductor module. The semiconductor module comprises: a wiring layer having a bump; a substrate having a semiconductor device and an electrode connected electrically to the semiconductor device on its surface and positioned so as to correspond to the bump; and an insulating layer provided between the wiring layer and the substrate, wherein, the bump and the electrode are connected electrically while the bump is penetrating through the insulating layer, and the region between the sides of the wiring layer and the principle surface of the wiring layer on the opposite side of the insulating layer are chamfered.

Another aspect of the present invention relates to mobile devices. The mobile device carries a semiconductor module of the above described aspect.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

A description of the embodiments which embody the present invention will now be given based on figures. In the figures, like numerals represent like constituting elements, and the description thereof is omitted appropriately.

Embodiment 1

Figure 1:
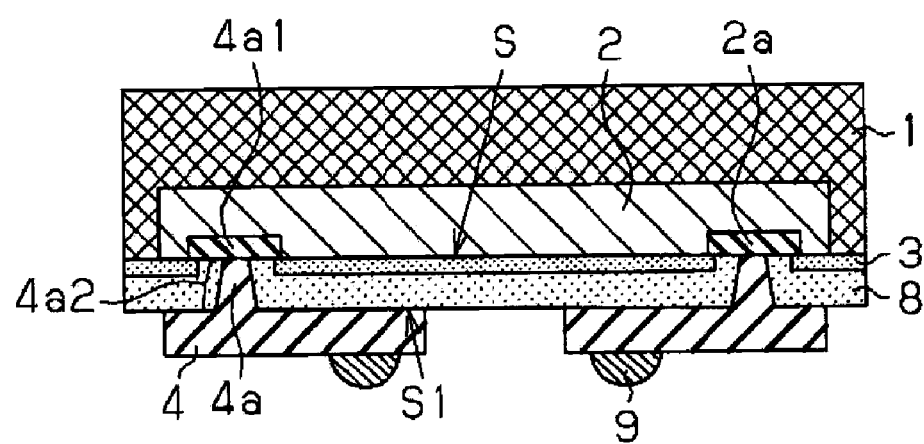
FIG. 1 is a schematic sectional view of a semiconductor module according to the embodiment 1.

FIG. 1 is a schematic section showing the semiconductor module according to the embodiment. A description will now be given of the semiconductor module according to the embodiment with reference to FIG. 1.

A semiconductor substrate 1 according to the semiconductor module of the embodiment is embodied by, for example, a p-type silicon substrate. A predetermined semiconductor device 2, for example, an electrical circuit is formed on the surface S (lower surface) thereof by applying a well-known technology. An electrode 2a which is electrically connected to the semiconductor device 2 is formed on the mounting surface S (particularly, the periphery of the semiconductor device 2). A protective film 3 is formed on at least a part of the surface of the semiconductor substrate 1 so that a predetermined region (central part) of the electrode 2a is exposed. In order to secure a large gap between the electrodes 2a on the surface S of the semiconductor substrate 1, an insulating layer 8 is formed on the electrode 2a and the protective film 3; and a bump 4a, which is connected to the exposed surface of the electrode 2a while penetrating through the insulating layer 8, and a rewiring pattern 4, which is integral with the bump 4a, are formed. The bump 4a is provided on a first principle surface S1 of the rewiring pattern 4, and an external connection electrode (solder ball) 9 is provided on a predetermined region of the opposite surface (lower surface) of the first principle surface S1 in order to perform signal sending and receiving to and from outside of the semiconductor module.

More specifically, the insulating layer 8 is formed on the surface S of the semiconductor substrate 1 and has a thickness of about 35 μm. Preferably, the insulating layer 8 is of a material that develops plastic flow when applied pressure. Epoxy thermosetting resin will be mentioned as a material that undergoes plastic flow when applied pressure, by way of example. For example, epoxy thermosetting resin used for the insulating layer 8 may be a material exhibiting the viscosity of 1 kPa·s at the temperature of 160° C. and the pressure of 8 MPa. If the material is pressured at 15 MPa under the temperature of 160° C., the viscosity of the resin will drop to ⅛ the level exhibited when the resin is not pressured.

The rewiring pattern 4 is formed on the insulating layer 8. A bump 4a, projecting from the first principle surface S1, which penetrates through the insulating layer 8, is provided integrally on the rewiring pattern 4. For example, a rolled metal comprising rolled copper is applied for the rewiring pattern 4 and the bump 4a. Compared to a metal film formed by, for example, plating process, the rolled metal comprising rolled copper exhibits higher mechanical strength and thus is a better candidate for a rewiring material. The rewiring pattern 4 has a thickness of, for example, about 20 μm and the bump 4a has a height (thickness) of, for example, about 35 μm. The bump 4a is formed in the shape in which the apex of a cone is removed so that the plane at the top portion of the resultant cone is parallel to the base of the cone (hereinafter, referred to as "truncated cone"), and is provided with an end part unit 4a1 parallel with the contact surface of the electrode 2a of the semiconductor substrate 1, and with a side part 4a2 formed to be progressively smaller in diameter (dimension) toward the end part unit 4a1. The diameter of the bump 4a at the end part (end part unit 4a1) and the diameter at the base are about 35 μmφ and about 50 μmφ, respectively. The bump 4a is positioned in association with the electrode 2a. The end part (end part unit 4a1) of the bump 4a is formed so as to have direct contact with the electrode 2a of the semiconductor substrate 2, and connects the electrode 2a and the rewiring pattern 4 electrically.

The semiconductor substrate 1 is an example of the "substrate" according to the invention, the semiconductor device 2 is an example of the "semiconductor device" according to the invention, the electrode 2a is an example of the "electrode" according to the invention, the bump 4a is an example of the "bump" according to the invention, the trench 4b is an example of the "trench" according to the invention, the insulating layer 8 is an example of the "insulating layer" according to the invention, and the rewiring pattern 4 is an example of the "wiring layer" according to the invention.

(Manufacturing Method)

FIGS. 2 and 3 are schematic sections illustrating a method of forming a copper plate having a bump and a trench. FIG. 4 is a plan view (top view) showing a semiconductor wafer in which a semiconductor substrate sectioned along a plurality of scribe lines is positioned in a matrix. FIGS. 5 and 6 are schematic sections illustrating a manufacturing process of the semiconductor module according to the embodiment. A description will now be given of the manufacturing process of the semiconductor module according to the embodiment with reference to FIGS. 1 through 6.

Figure 2A:
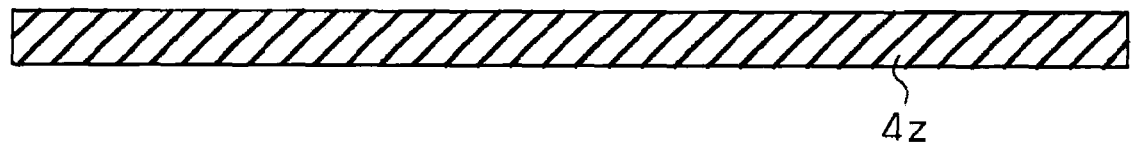
FIGS. 2A-2D are schematic sectional views illustrating a method of forming a copper plate having a bump and a trench.

As shown in FIG. 2A, a flat copper plate 4z is prepared having at least a thickness of larger than the sum of the height of the bump 4a and the rewiring pattern 4. A rolled metal comprising rolled copper is used for the copper plate 4z and the thickness of the copper plate 4z is about 100 μm. The flat copper plate 4z is an example of the "flat metal plate" according to the invention.

Figure 2B:
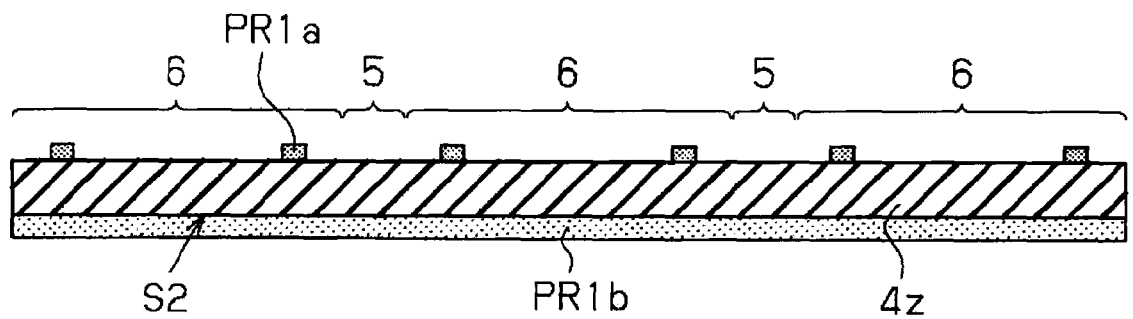

As shown in FIG. 2B, lithographic technology is employed to form a resist mask PR1a in the region inside of each semiconductor module forming region 6 where the bump is formed. The arrangement of the region where the bump is formed is in association with the position of the respective electrode 2a of the semiconductor substrate 1 in the semiconductor wafer which is sectioned into a plurality of the semiconductor module forming regions 6 along a plurality of the scribe lines 5. An alignment pattern unit (see FIG. 7) is formed at this time on the resist mask PR1a in a predetermined region (predetermined position) outside of the semiconductor module forming region 6, for example, scribe lines 5. An alignment mark, for example, a cross, a square, or a circle is used for the pattern unit and the size (length) of the mark ranges from, for example, about 5 µm to 500 µm. A resist protecting layer PR1b is then formed on the opposite side of the surface (second principle surface S2) on which the resist mask PR1a is formed in order to protect the copper plate 4z. The scribe line 5 is an example of the "scribe region" according to the invention.

Figure 2C:
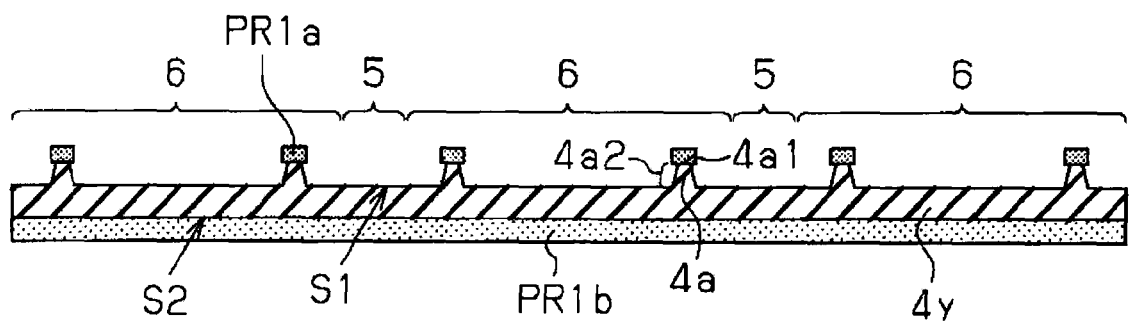

As shown in FIG. 2C, by performing wet etching with a chemical solution, for example, a ferric chloride solution, using the resist mask PR1a as a mask so as to form isolation trenches on the surface of the copper plate 4z, a bump 4a is formed having predetermined truncated cone patterns projecting from the first principle surface S1 of a copper plate 4y. The bump 4a is formed to have a tapered side part unit 4a2 which is progressively smaller in diameter (dimension) toward the end part unit 4a1. The height of the bump 4a is about 35 µm, and the diameter of the bump 4a at the end part (end part unit 4a1) and the diameter at the base are about 35 µmφ and about 50 µmφ, respectively. The second principle surface S2 of the copper plate 4y is protected with the resist protecting layer PR1b in the above mentioned process.

Figure 2D:
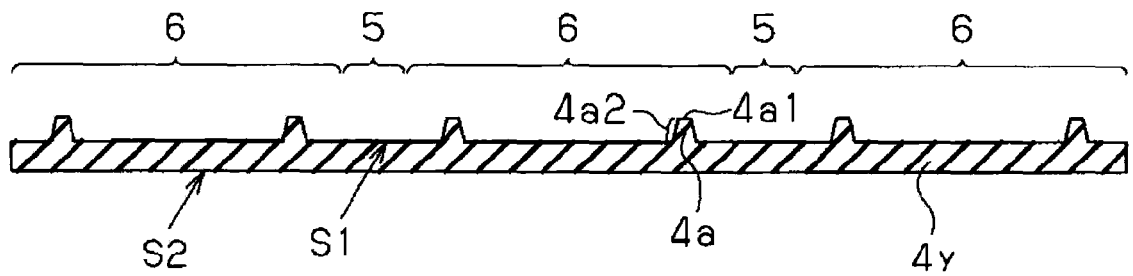

As shown in FIG. 2D, the resist mask PR1a and the resist protecting layer PR1b are then removed. In this manner, the bump 4a is formed, having the end part unit 4a1 and the side part unit 4a2 which is progressively smaller in diameter toward the end part unit 4a1, to be integral with the first principle surface S1 of the copper plate 4y. An alignment pattern unit (see FIG. 7) is formed for a predetermined region (predetermined position) outside of the semiconductor module forming region 6, for example, scribe lines 5. Instead of the resist mask PR1a, a metal mask such as silver (Ag) may be used. In this case, the microfabrication of the patterning of the bump and the alignment pattern unit can be improved since an etching selection ratio to the copper plate 4z is ensured.

Figure 3A:
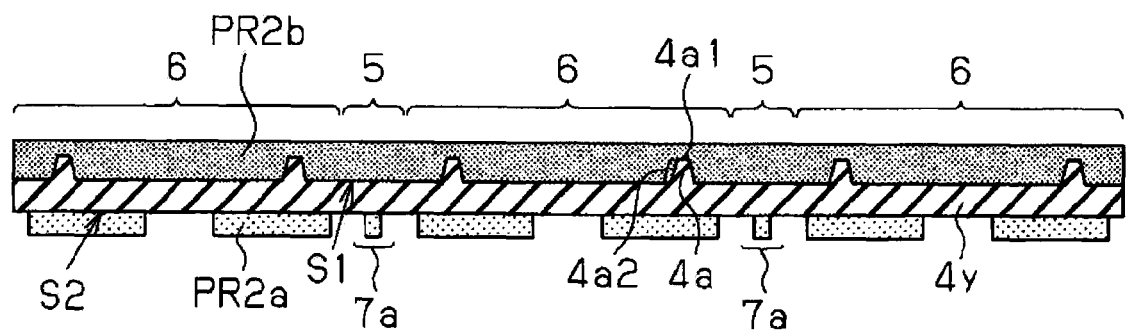
FIGS. 3A-3C are schematic sectional views illustrating a method of forming a copper plate having a bump and a trench.
Figure 4:
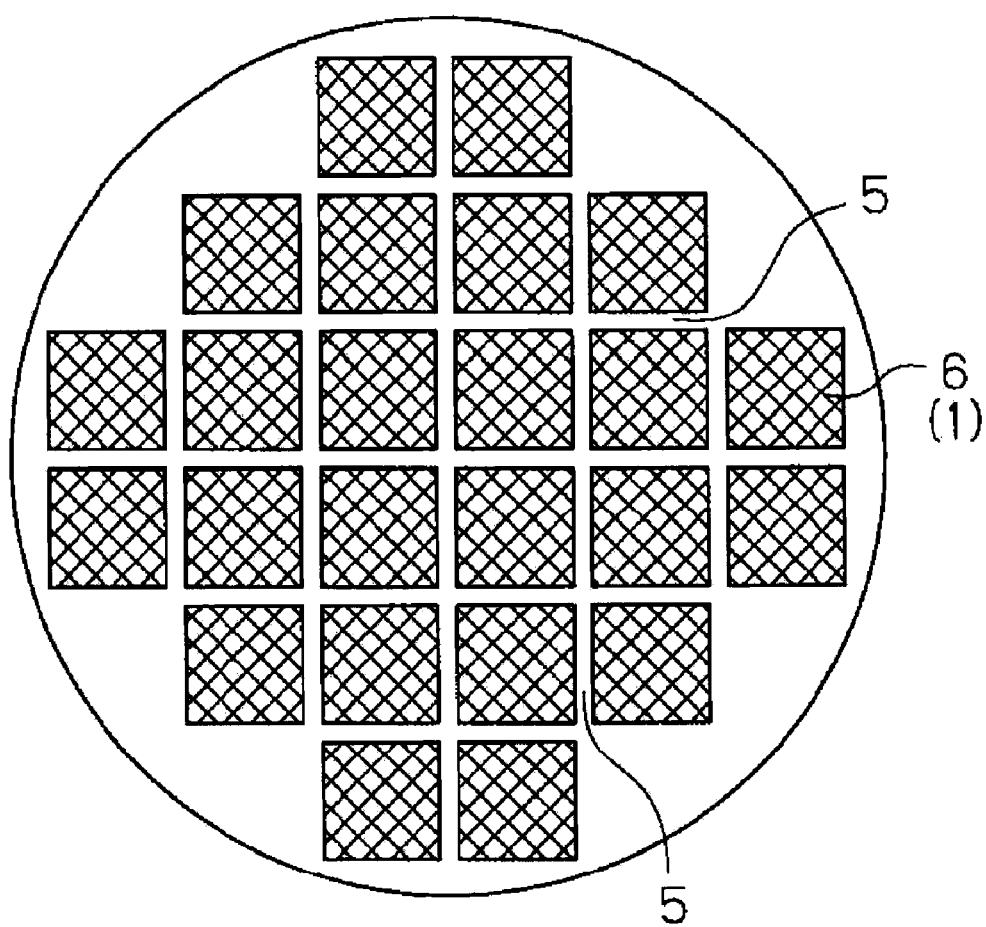
FIG. 4 is a plan view showing a semiconductor wafer in which a semiconductor substrate sectioned along a plurality of scribe lines is positioned in a matrix.

As shown in FIG. 3A, alignment is performed using the alignment pattern unit formed on the first principle surface S1 of the copper plate 4y as a mark, and a resist mask PR2a is then formed in a trench forming region of the second principle surface S2 of the copper plate 4y by lithographic technology. An alignment pattern unit 7a is formed at this time on the resist mask PR2a in a predetermined region (predetermined position) outside of the semiconductor module forming region 6, for example, scribe lines 5. An alignment mark, for example, a cross, a square, or a circle is used for the alignment pattern unit 7a and the size (length) of the mark ranges from, for example, about 5 µm to about 500 µm. A resist protecting layer PR2b is then formed on the opposite side of the surface (first principle surface S2) on which the resist mask PR2a is formed in order to protect the copper plate 4y. The method for the alignment during the formation of the resist mask PR2a will hereinafter be described in detail.

Figure 3B:
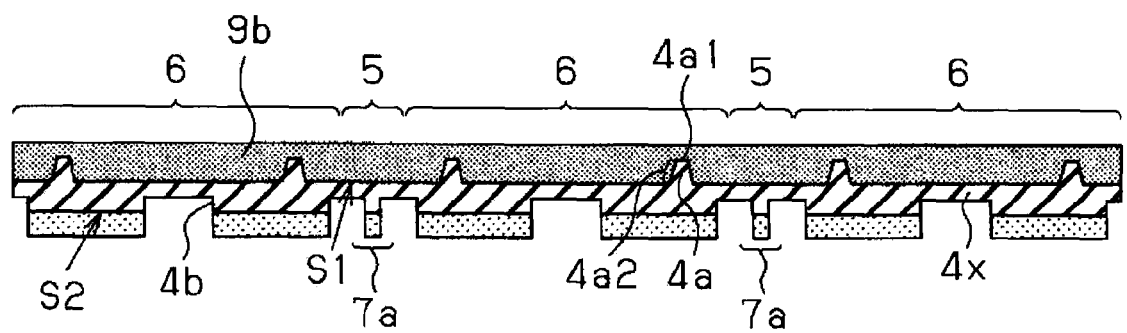

As shown in FIG. 3B, wet etching with a chemical solution (e.g., a ferric chloride solution) is performed using the resist mask PR2a as a mask so as to form a trench 4b, dug from the second principle surface S2 of a copper plate 4x, on a copper plate 4x. The trench 4b has a depth of about 20 µm. In this manner, the trench 4b is formed to be a space pattern in association with the rewiring pattern 4 provided with the alignment pattern unit 7a and the predetermined line or space pattern.

Figure 3C:
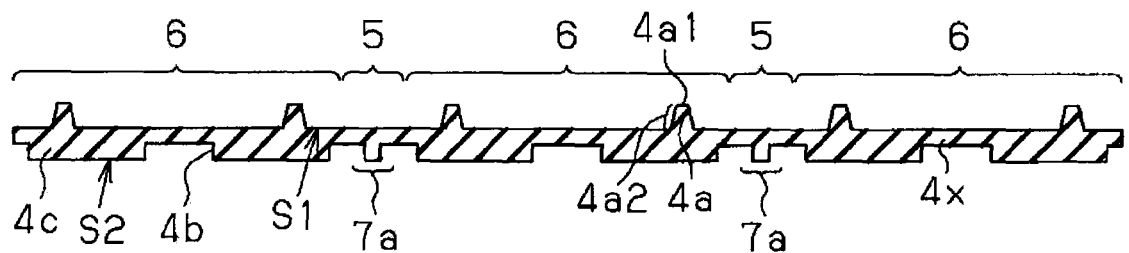

As shown in FIG. 3C, the resist mask PR2a and the resist protecting layer PR2b are removed. With this, the copper plate 4x is formed having the bump 4a projecting from the first principle surface S1 of the copper plate 4x and trench 4b dug from the second principle surface S2.

A copper plate 4x thus manufactured is used in the process described below of manufacturing the semiconductor module according to the embodiment.

Figure 5A:
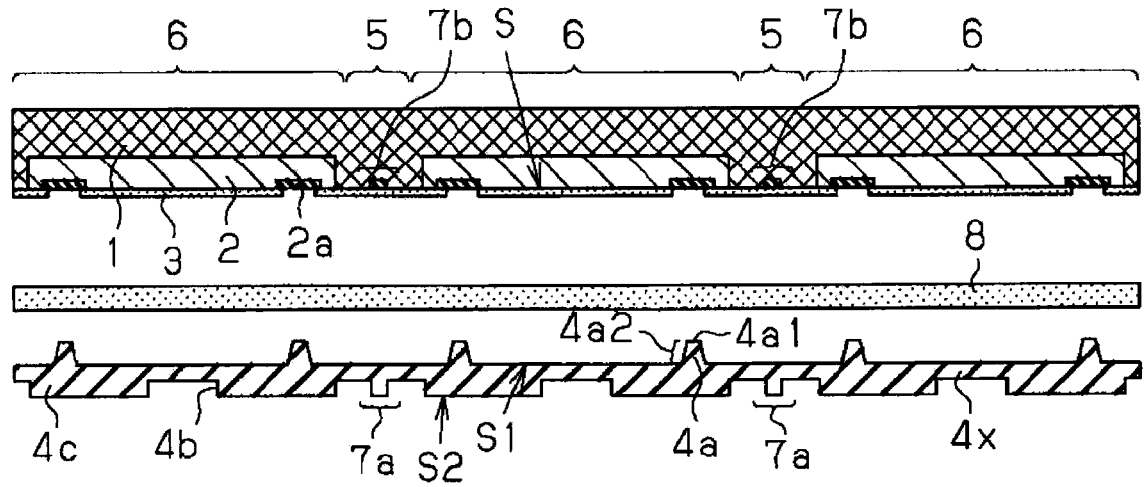
FIGS. 5A-5C are schematic sectional views illustrating the process of manufacturing the semiconductor module.

As shown in FIG. 5A, a semiconductor wafer is prepared which is the semiconductor substrate 1 formed in a matrix on the surface S, having a semiconductor device 2, an electrode 2a, and a protecting layer 3. The semiconductor wafer, as shown in FIG. 4, is sectioned into a plurality of the semiconductor module forming regions 6 (semiconductor substrate 1) in a lattice form by a plurality of the scribe lines 5. This semiconductor module forming region 6 is the region where the previously stated semiconductor module is formed.

More specifically, as shown in FIG. 5A, a semiconductor device 2 (e.g., predetermined electrical circuit) is formed, by a well-known technology, on the lower surface S of the semiconductor substrate 1 embodied by, for example, a p-type silicon substrate, and the electrode 2a, which is connected electrically to the semiconductor device 2, is formed around or above the semiconductor device 2. An alignment pattern unit 7b is formed in a predetermined position on the surface S of the semiconductor substrate 1, in the region (e.g., scribe line 5) in association with the alignment pattern unit 7a used for the alignment of the copper plate 4x. A mark which pairs up with the alignment pattern unit 7a of the copper plate 4x is used for the alignment pattern unit 7b, out of an alignment mark, for example, a cross, a square, or a circle. Also, a metal (e.g., aluminum) is used as a material for the electrode 2a and the alignment pattern unit 7b. An insulating protective film 3 for protecting the semiconductor substrate 1 is formed on at least a part of the surface S of the semiconductor substrate 1 excluding a predetermined region (central part). The protective film 3 may comprise a silicon oxide (SiO2) film or a silicon nitride (SiN) film. The alignment pattern unit 7b is an example of the "first pattern unit" according to the invention.

By adjusting the position of the copper plate 4x in order for the alignment pattern unit 7a, which is formed on the second principle surface of the copper plate 4x, and for the alignment pattern unit 7b, which is formed on the surface S of the semiconductor substrate 1, to have a predetermined positional relation (e.g., the state in which the alignment pattern units 7a and 7b are superimposed on each other), the bump 4a and the electrode 2a of the semiconductor substrate 1 are aligned (superimposed on each other). Subsequently, the insulating layer 8 is sandwiched between the surface S of the semiconductor substrate 1 and the first principle surface S1 of the copper plate 4x having the bump 4a. The thickness of the insulating layer 8 is about 35 µm which is nearly equal to the height of the bump 4a. The method for the alignment of the copper plate 4x and the semiconductor substrate 1 will hereinafter be described in detail.

Figure 5B:
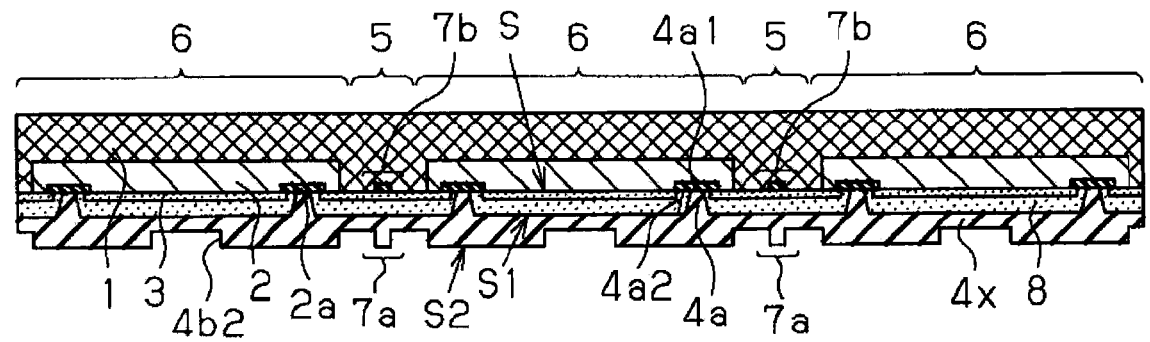

As shown in FIG. 5B, the semiconductor substrate 1, the insulating layer 8, and the copper plate 4x are integrated and laminated by pressure molding the assembly as described above using a press machine. The pressure and the temperature of the press work are about 5 MPa and 200° C., respectively. The press work lowers the viscosity of the insulating layer 8 so that the insulating layer 8 undergoes plastic flow. As a result, the bump 4a penetrates the insulating layer 8 and the bump 4a and the electrode 2a become connected electrically. Having the side part 4a2 which is formed to be progressively smaller in diameter toward the end part unit 4a1, the bump 4a penetrates the insulating layer 8 smoothly. As a result, the insulating layer 8 is effectively pushed out of an interface between the bump 4a and the electrode 2a, leaving almost no residue of the insulating layer 8 in the interface.

Figure 5C:
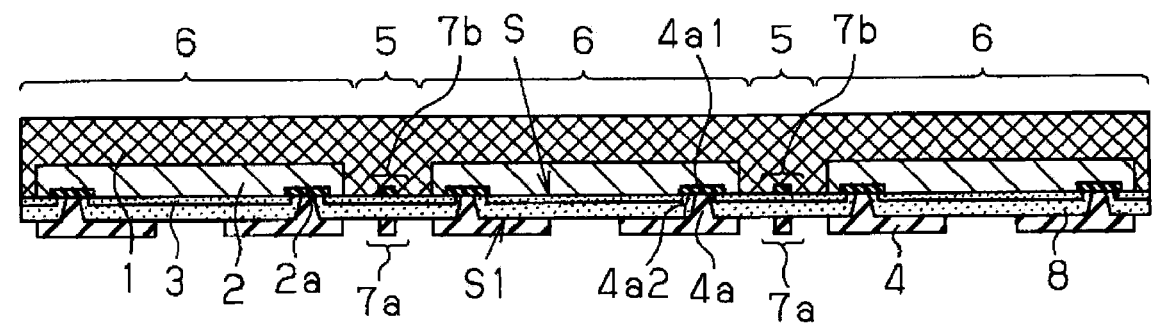

As shown in FIG. 5C, blanket etch-back is performed on the second principle surface S2 of the copper plate 4x using etching process so as to remove the bottom part of the trench 4b, working the copper plate 4x uniformly into thin film. As a result, the rewiring pattern 4 having the alignment pattern unit 7a and the predetermined line or space pattern to which the space pattern of the trench 4b is reflected is formed automatically. As for the thickness of the rewiring pattern 4, the depth of the trench 4b is reflected, and the thickness is about 20 μm. Since the rewiring pattern 4 is formed by performing blanket etch-back on the second principle surface S2 of the copper plate 4x, the corners, more specifically, the region between the sides of the rewiring pattern 4 and the principle surface of the rewiring pattern 4 on the opposite side of the insulating layer 8 are chamfered to, for example, round shapes. For this reason, the photo solder resist can easily enter between the rewiring patterns 4, when, for example, a photo solder resist (not shown) is laminated as a protective layer to protect the rewiring pattern 4 before an external connection electrode (solder ball) 9, which will be described hereinafter, is formed on the rewiring pattern 4. As a result, in spite of the microfabrication of the wiring pitch in accordance with the reduction in size of the semiconductor device 2, voids are not likely formed between the rewiring pattern 4 and the photo solder resist; and thus, the peeling of the photo solder resist can be avoided.

Figure 6A:
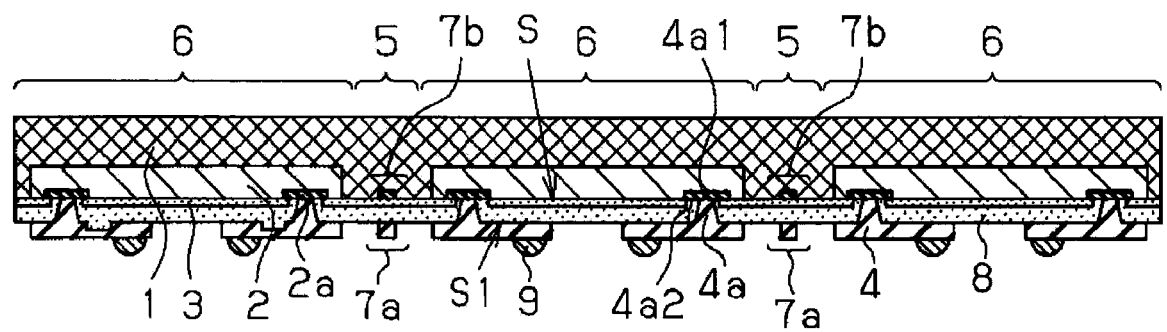
FIGS. 6A and 6B are schematic sectional views illustrating the process of manufacturing the semiconductor module according to the embodiment.

As shown in FIG. 6A, solder printing is used to form an external connection electrode (solder ball) 9 on the rewiring pattern 4 connected to the electrode 2a via the bump 4a, which functions as a terminal for the signal exchange with outside of the semiconductor module. More specifically, the external connection electrode (solder ball) 9 is formed by printing a solder paste, which is resin and a solder material in paste form, on the desired area using a screen mask, followed by heating until the temperature reaches the solder melting temperature. Alternatively, the solder ball may be mounted on the rewiring pattern 4 by coating flux on the side of the rewiring pattern 4.

Figure 6B:
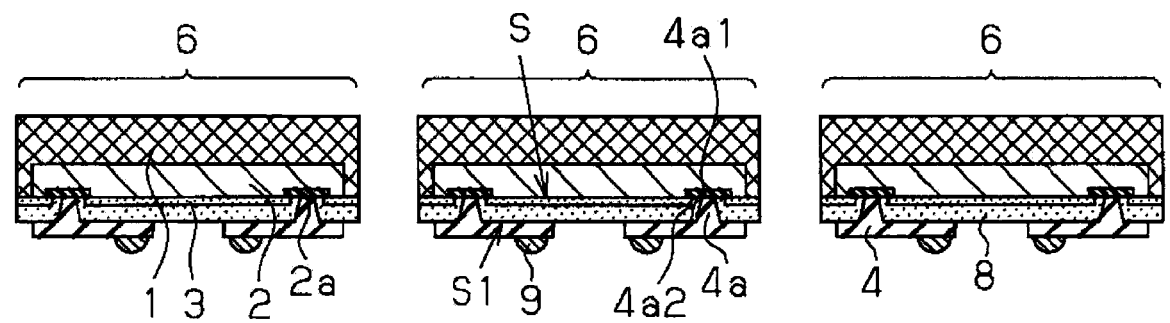

As shown in FIG. 6B, the semiconductor substrate is singulated by dicing the semiconductor wafer along the scribe line 5 which sections a plurality of semiconductor modules forming regions 6. The washing process with a chemical solution is then performed in order to remove the residue formed during the dicing.

Through these steps, the semiconductor module of FIG. 1 according to the embodiment is manufactured.

A description will now be given of a method of alignment according to the embodiment on a metal plate (copper plate) which has a bump.

Figure 7A:
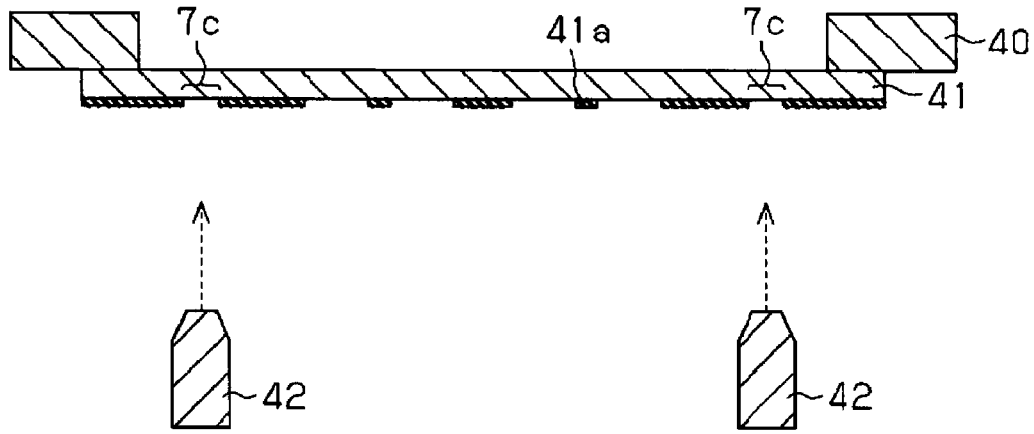
FIGS. 7A-7C are schematic sectional views illustrating the method of alignment.
Figure 7B:
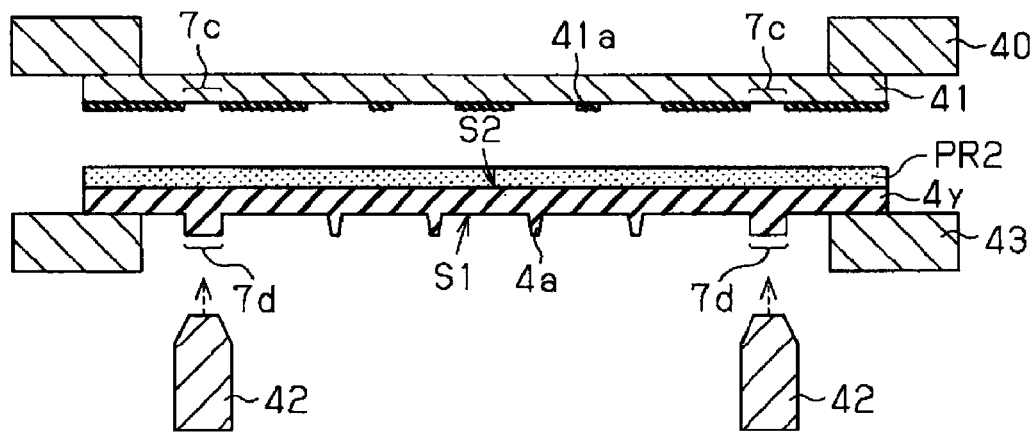

FIG. 7 is the schematic section illustrating the method of alignment when a trench is formed on the second principle surface of a copper plate which has a bump on the first principle surface.

As shown in FIG. 7A, in an exposure apparatus having alignment function, when forming a trench on the second principle surface S2 of the copper plate 4y using a trench formation mask (mask provided with a predetermined line or space pattern 41a and an alignment pattern unit 7c) 41 which is fixed to a mask holder 40, the image of the alignment pattern unit 7c of the trench formation mask 41 (alignment pattern unit 7c) is first projected and then captured by an image capturing means 42 (e.g., CCD camera) which is installed below the trench formation mask 41 (alignment pattern unit 7c). The data of the image captured is then transferred into a computer and the image of the alignment pattern unit 7c is saved.

As shown in FIG. 7, the copper plate 4y, which is fixed to a substrate holder 43, is inserted into the predetermined position. Through the steps shown in FIGS. 2A-2D, for the copper plate 4y, a bump 4a and an alignment pattern unit 7d are formed on the first principle surface S1, and a resist layer PR2 is deposited over the second principle surface S2. The copper plate 4y is fixed to the substrate holder 43 so that the resist layer PR2 on the second principle surface S2 faces to the trench formation mask 41. The alignment pattern unit 7d is an example of the "second pattern unit" according to the invention.

The image of the alignment pattern unit 7d of the copper plate 4y is then captured by the same image capturing means 42 (e.g., CCD camera) described previously.

Subsequently, based on the position of the previously saved image of the alignment pattern unit 7c of the trench formation mask 41, the image of the alignment pattern unit 7d of the copper plate 4y is superimposed over the image of the alignment pattern unit 7c; and then, the substrate holder 43 is moved and the holder's position is adjusted so that the both images have the predetermined positional relation. The alignment of the copper plate 4y and the trench formation mask 41 is performed as described above.

Figure 7C:
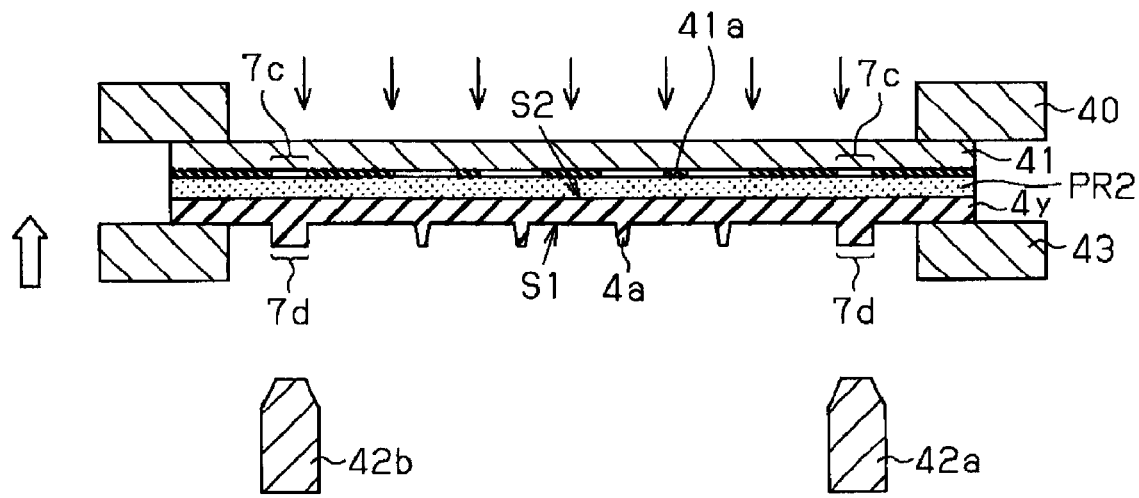

As shown in FIG. 7C, the substrate holder 43 is moved toward the trench formation mask 41 while the trench formation mask 41 and the copper plate 4y are aligned so that the resist layer PR2 is exposed while being close to or in contact with the trench formation mask 41. After the exposure, the resist mask PR2a shown in FIG. 3A is formed through steps of predetermined heat treatment and development.

As described above, the alignment can be performed using the alignment function of the exposure apparatus; and thus, the high-accuracy alignment can be easily realized.

FIG. 8 is the schematic section illustrating the method of alignment of the bump of the copper plate and the electrode of the semiconductor substrate.

Figure 8A:
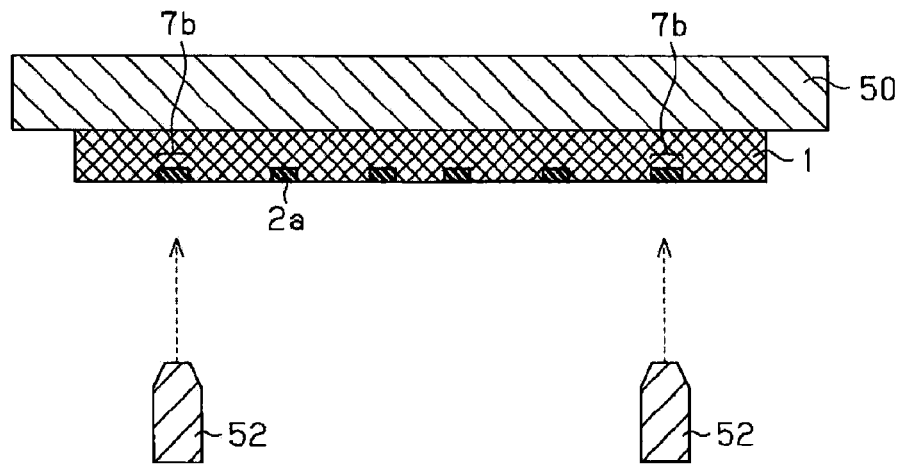
FIGS. 8A-8C are schematic sectional views illustrating the method of alignment.

As shown in the FIG. 8A, the image of the alignment pattern unit 7b formed on the semiconductor wafer (semiconductor substrate 1 provided with the electrode 2a and the alignment pattern unit 7b) is projected which is fixed to a fixing holder 50 in a pressure-bonding device (bonder) having the alignment function; the image is then captured by an image capturing means 52 (e.g., CCD camera) which is installed below the semiconductor wafer (semiconductor substrate 1). The data captured is then transferred into a computer and the image of the alignment pattern unit 7b is saved.

Figure 8B:
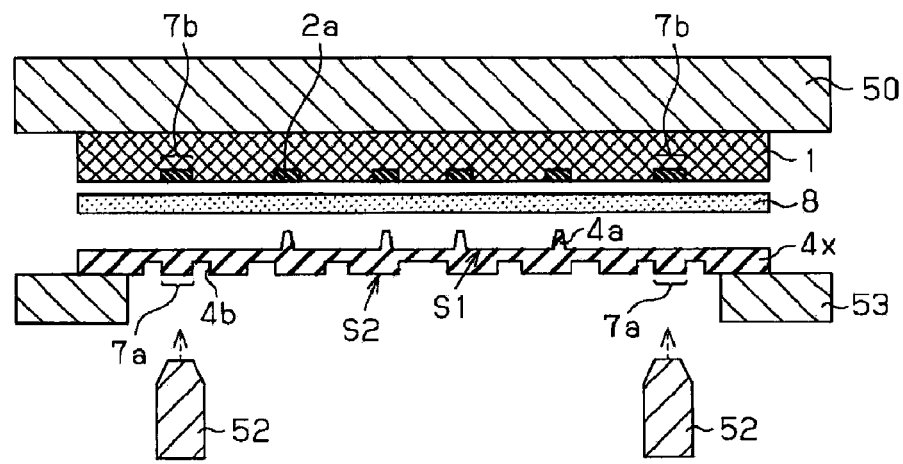

As shown in FIG. 8B, the copper plate 4x, fixed to a substrate holder 53, is inserted into the predetermined position, and the insulating layer 8 is placed between the semiconductor wafer (semiconductor substrate 1) and the copper plate 4x. The bump 4a and the alignment pattern unit (see FIG. 7) are formed on the first principle surface S1 of the copper plate 4x; and the trench 4b having a predetermined pattern and the alignment pattern unit 7a are formed on the second principle surface S2. The copper plate 4x is fixed to the substrate holder 53 so that the bump 4a on the first principle surface S1 faces to the semiconductor wafer (semiconductor substrate 1).

The image of the alignment pattern unit 7a of the copper plate 4x is then captured by the same image capturing means 52 (e.g., CCD camera) described previously. Subsequently, based on the position of the previously saved image of the alignment pattern unit 7b of the semiconductor wafer (semiconductor substrate 1), the image of the alignment pattern unit 7a of the copper plate 4x is superimposed over the image of the alignment pattern unit 7b; and then, the substrate holder 53 is moved and the holder's position is adjusted so that the both images have the predetermined positional relation. The alignment of the copper plate 4x and the semiconductor wafer (semiconductor substrate 1) is performed as described above.

Figure 8C:
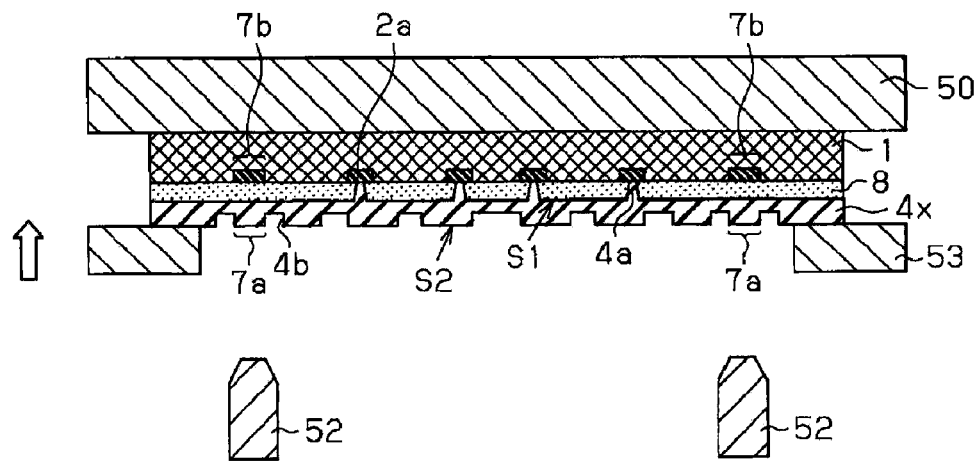

As shown in the FIG. 8C, while the copper plate 4x and the semiconductor wafer (semiconductor substrate 1) are aligned, the substrate holder 53 is moved toward the semiconductor wafer (semiconductor substrate 1) so that the copper plate 4x is pressure-bonded to the semiconductor wafer (semiconductor substrate 1) via the insulating layer 8. The bump 4a and the electrode 2a of the semiconductor substrate 1 become connected electrically by the bump 4a penetrating the insulating layer 8. The pressure-bonding may be performed using different device after the alignment.

The steps described previously in FIGS. 5A and 5B are performed as described above, and the alignment can be performed using the alignment function of the pressure-bonding device (bonder). Thus, the high-accuracy alignment can be easily realized.

According to the method of manufacturing the semiconductor module of the embodiment, the following advantages are provided.

(1) In the copper plate 4x having the bump 4a on its first principle surface, the trench 4b is formed on the second principle surface S2 opposite to the first principle surface S1 and then used as a mark for the alignment for the pressure-bonding of the copper plate 4x to the semiconductor substrate 1. With this, the conventional step of forming an alignment pattern unit (through hole for alignment) processed with a drill becomes unnecessary; and accordingly, the semiconductor module can be manufactured at a reduced cost. Also, the alignment can be performed with the same processing accuracy as that of the rewiring pattern 4, using the trench 4b, in association with the space pattern of the rewiring pattern 4, as a mark for the alignment. Thus, the alignment can be performed with higher accuracy as compared to the conventional alignment using the alignment pattern unit (through hole for alignment) processed with a drill. As a result, in the pressure-bonding of the bump 4a of the copper plate 4x and the electrode 2a of the semiconductor substrate 1, the semiconductor module, having the bump 4a, and the electrode 2a, aligned with high accuracy, can be manufactured at a reduced cost.

(2) For the copper plate 4x having the bump 4a on its first principle surface S1, the trench 4b, in association with the space pattern of the rewiring pattern 4, is formed on the second principle surface S2, which is opposite to the first principle surface, and followed by the pressure-bonding of the copper plate 4x to the semiconductor substrate 1. The copper plate 4x is then processed into the rewiring pattern 4 by penetrating the bottom part of the trench 4b. With this, the lithography step of forming the rewiring pattern 4 after the pressure-bonding becomes unnecessary; and accordingly, the semiconductor module can be manufactured at a reduced cost.

(3) In the copper plate 4x having the bump 4a on its first principle surface S1, the copper plate 4x is worked into thin film at least at the part of the trench 4b by providing the trench 4b on the second principle surface S2 opposite to the first principle surface S1, resulting in the reduced warpage of the copper plate 4x. Thus, the accuracy of the alignment in the pressure-bonding of the copper plate 4x and the semiconductor substrate 1 is further improved.

(4) After the formation of the bump 4a on one side of the flat copper plate 4z, the trench 4b is formed, using the alignment pattern unit 7d as a standard without employing the conventional alignment pattern unit (through hole for alignment) processed with a drill, on the other side of the flat copper plate 4z. Thus, the positional relation of the trench 4b and the bump 4a, which is formed on the opposite side of the trench 4b, is controlled with high accuracy. Therefore, when the trench 4b is used as a mark for the alignment, the alignment of the bump 4a and the electrode 2a of the semiconductor substrate 1 can be performed with further improved accuracy.

(5) The scribe line 5 is generally a lattice form region which sections a plurality of the semiconductor devices 2 which are formed in a matrix on the semiconductor wafer (semiconductor substrate 1) into individual semiconductor devices, and is removed when the semiconductor wafer (semiconductor substrate 1) is singulated by dicing. For this reason, the trench 4b (alignment pattern unit 7a) can be formed in the scribe line 5 with disregard to the layout of the rewiring pattern 4 (e.g., the electrode 2a of the semiconductor device 2); and the trench 4b can be used in common for the manufacturing of another semiconductor device. Therefore, in the pressure-bonding of the copper plate 4x and the semiconductor substrate 1, by further forming the trench 4b of the copper plate 4x (alignment pattern unit 7a) in the scribe line 5 which sections a plurality of the semiconductor devices 2, the semiconductor module, having the bump 4a and the electrode 2a aligned with improved accuracy, can be manufactured at a reduced cost.

(6) Since the rewiring pattern 4 is formed by pressure-bonding the copper plate 4x, which are provided with the bump 4a and the trench 4b, all at once while the semiconductor module is in the state of the semiconductor wafer before the singulation, the manufacturing cost of the semiconductor module is reduced as compared to a case where, for example, the rewiring pattern 4 is formed by pressure-bonding the copper plate 4x individually to the respective semiconductor module.

(7) According to this manufacturing method, the alignment of the bump 4a of the copper plate 4x and the electrode 2a of the semiconductor substrate 1 can be performed with high accuracy, resulting in the reduction in the alignment margin; and thus, for example, the microfabrication of the size (dimension) of the electrode 2a of the semiconductor substrate 1 can be achieved. Therefore, the size of the semiconductor module can be reduced.

(8) Since the region between the sides of the rewiring pattern 4 and the principle surface of the rewiring pattern 4 on the opposite side of the insulating layer 8 are chamfered, the protective layer can likely enter between the rewiring patterns 4 when the protective layer is laminated to protect the rewiring pattern 4. As a result, in spite of the microfabrication of the wiring pitch in accordance with the reduction in size of the semiconductor device 2, voids are not easily formed between the rewiring pattern 4 and the protective layer; and thus, the peeling of the protective layer can be avoided. Thus, the mounting reliability of the semiconductor module is improved.

Embodiment 2

In the above-described embodiment 1, the bump 4a is formed on the copper plate 4z at the position in association with each electrode 2a of the semiconductor substrate 1. A difference in this embodiment from the embodiment 1 resides in that the bump 4a is formed at the position based on the following: a difference in respective coefficient of thermal expansion of the copper plate 4x and the semiconductor substrate 1, a heating temperature applied during the pressure-bonding of the copper plate 4x and the semiconductor substrate 1, and a distance from the reference point of the copper plate 4x which is not moved by the expansion caused due to the heating. A description will now be given of the embodiment. Like numerals represent like structures and methods as in the embodiment 1, and the description thereof is omitted.

FIGS. 9 and 10 are schematic sections illustrating the method of forming a copper plate having a bump and a trench according to the embodiment. FIG. 11 is a schematic section illustrating the process of manufacturing the semiconductor module according to the embodiment.

Figure 9A:
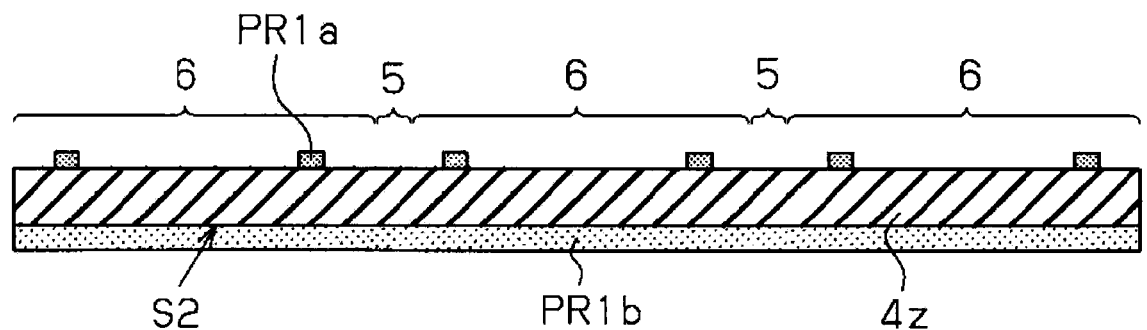
FIGS. 9A-9C are schematic sectional views illustrating a method of forming a copper plate having a bump and a trench according to the embodiment 2.

As shown in FIG. 9A, lithographic technology is employed to form a resist mask PR1a in the predetermined region of the prepared copper plate 4z where the bump is formed. The predetermined region where the bump is formed is the position displaced from the position opposite of the electrode 2a toward the opposite direction of the expansion of the copper plate 4x in accordance with the following: a difference in the coefficients of linear expansion of the copper plate 4x, which has the bump 4a and the trench 4b described hereinafter, and the semiconductor substrate 1, a heating temperature required during the pressure-bonding of the copper plate 4x and the semiconductor substrate 1, and a distance from the reference point of the copper plate 4x which is not moved by the expansion caused due to the heating. The coefficients of linear expansion of the copper plate 4x and the semiconductor substrate 1 composed of silicon are 17 ppm/° C. and 3 ppm/° C., respectively. The reference point which is not moved by the expansion caused due to the heating is normally the central point of the copper plate 4x.

As shown in FIG. 4, in the embodiment, the copper plate 4x is pressure-bonded to the semiconductor wafer in which a semiconductor substrate 1 defined along a plurality of scribe lines 5 is positioned in a matrix. The width of the scribe line 5 is narrowed by the distance in accordance with the difference in the coefficients of linear expansion of the copper plate 4x and the semiconductor substrate 1 and the heating temperature required during the pressure-bonding. More specifically, in the embodiment, the bump 4a of the copper plate 4x is displaced toward the center of the semiconductor wafer by the sectional unit of the copper plate 4x in association with the semiconductor substrate 1. Also, the point of the copper plate 4x in association with the central point of the semiconductor wafer is determined to be a reference point which is not moved by the expansion caused due to the heating, and the width of the each scribe line 5 is narrowed. Therefore, the further the distance of the sectional unit of the copper plate 4x from the reference point, the longer is the displacement toward the center; in other words, the bump 4a is displaced by the sectional unit of the distance in accordance with the distance from the reference point. More specifically, for example, if one side of the semiconductor substrate 1 measures 10 mm, respective width of the scribe line 5 is narrowed by 10 μm. In FIG. 9, the section of the copper plate 4z in the semiconductor module forming region 6 in the center is the section in association with the semiconductor substrate 1 in the center of the semiconductor wafer.

Figure 9B:
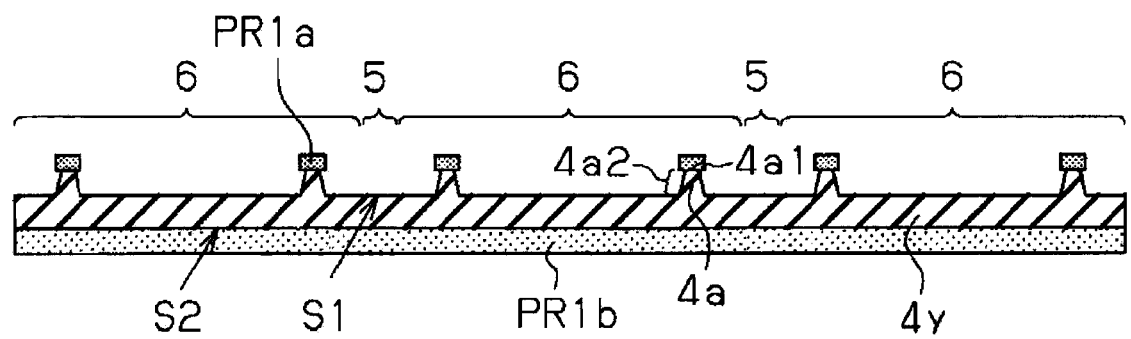

As shown in FIG. 9B, wet etching is performed, using the resist mask PR1a as a mask, so as to form a bump 4a.

Figure 9C:
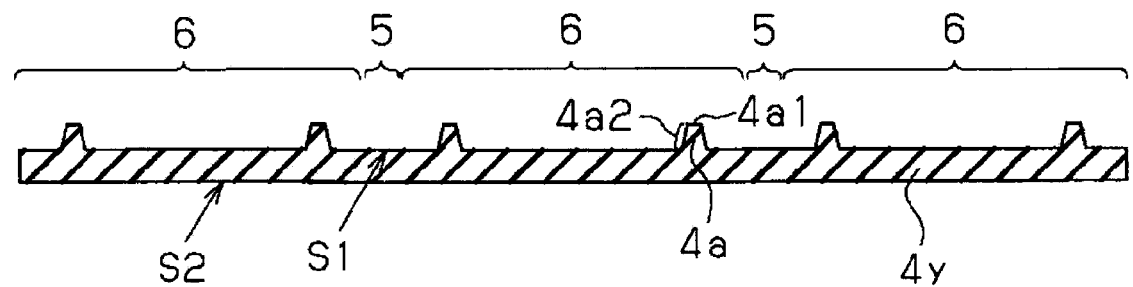

As shown in FIG. 9C, the resist mask PR1a and the resist protecting layer PR1b are then removed. With this, the bump 4a is formed integral with the first principle surface S1 of the copper plate 4y.

Figure 10A:
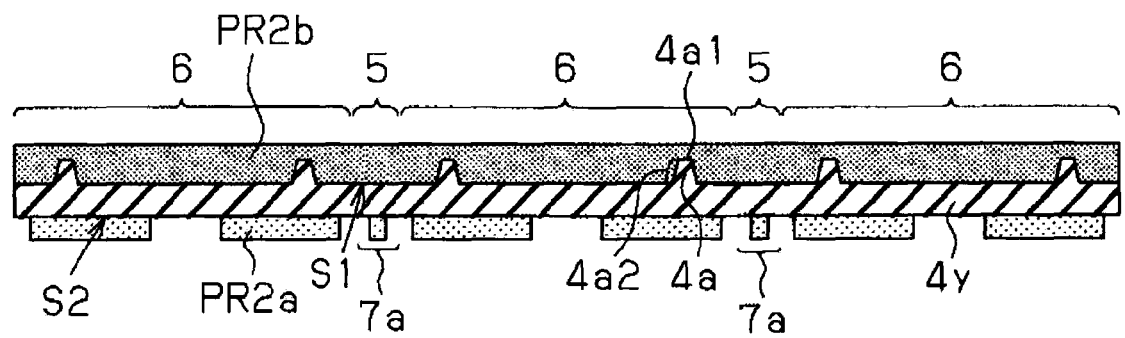
FIGS. 10A-10C are schematic sectional views illustrating a method of forming a copper plate having a bump and a trench.

As shown in FIG. 10A, lithographic technology is employed to form a resist mask PR2a in the trench forming region of the second principle surface S2 of the copper plate 4y.

Figure 10B:
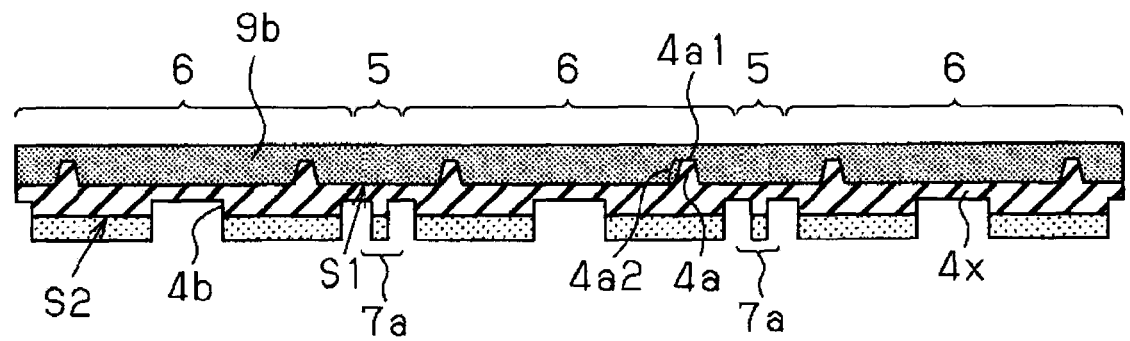

As shown in FIG. 10B, wet etching is performed, using the resist mask PR2a as a mask, so as to form a trench 4b. The trench 4b is formed, in association with the region where the bump 4a is formed, at the position displaced in a direction opposite to the expansion of the copper plate 4x by a distance in accordance with a difference in the coefficients of linear expansion of the copper plate 4x and the semiconductor substrate 1, a heating temperature, and a distance from the reference point of the copper plate 4x which is not moved by the expansion caused due to the heating. In the embodiment, for the semiconductor substrate 1 with one side measuring 10 mm, respective width of the scribe line 5 is narrowed by 10 μm so that the trench 4b is displaced toward the center of the semiconductor wafer by the sectional unit of the copper plate 4y in association with the respective semiconductor substrate 1.

Figure 10C:
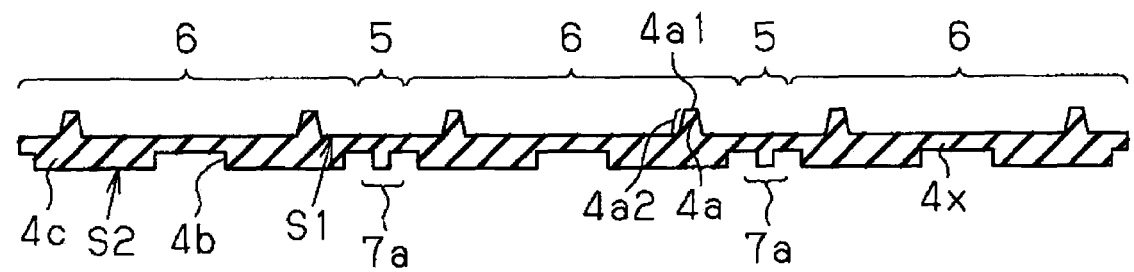

As shown in FIG. 10C, the resist mask PR2a and the resist protecting layer PR2b are then removed. With this, the copper plate 4x with the bump 4a and the trench 4b is formed.

A copper plate 4x thus manufactured is used in the process described below of manufacturing the semiconductor module according to the embodiment.

Figure 11A:
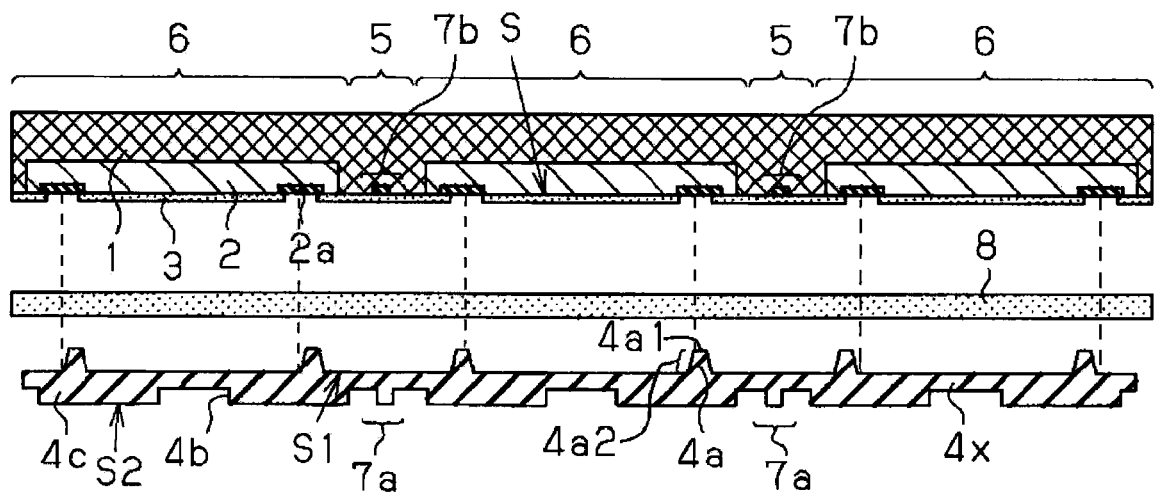
FIGS. 11A and 11B are schematic sectional views illustrating the process of manufacturing the semiconductor module.

As shown in FIG. 11A, a semiconductor wafer is prepared in which the semiconductor substrate 1, provided with the semiconductor device 2, the electrode 2a, and the protecting layer 3 on its surface S, is formed in a matrix. The insulating layer 8 is then sandwiched between the surface S of the semiconductor substrate 1 and the first principle surface S1 of the copper plate 4x having the bump 4a. As in the embodiment 1, the copper plate 4x and the semiconductor substrate 1 may be aligned by adjusting the position of the copper plate 4x so that alignment pattern unit 7a formed on the second principle surface S2 of the copper plate 4x and the alignment pattern unit 7b formed on the surface S of the semiconductor substrate 1 have a predetermined positional relation.

Figure 11B:
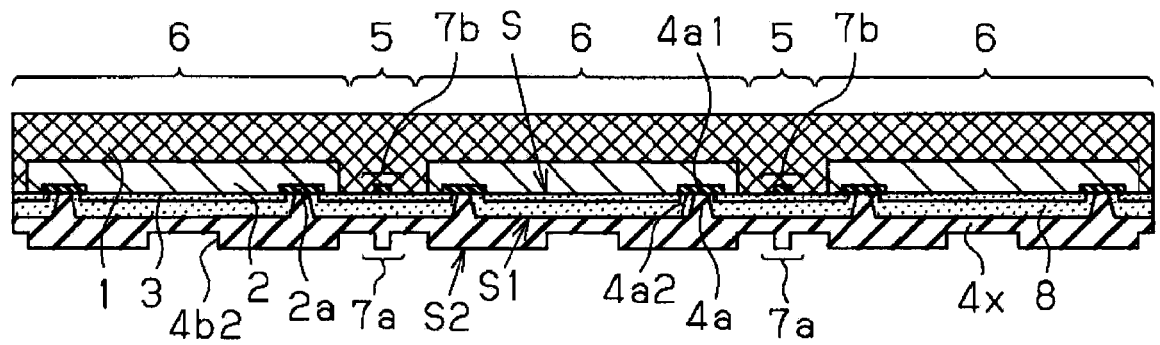

As shown in FIG. 11B, the semiconductor substrate 1, the insulating layer 8, and the copper plate 4x are integrated and laminated by pressure molding the assembly using a press machine. As a result, the bump 4a penetrates the insulating layer 8, and the bump 4a and the electrode 2a become connected electrically. Due to an increase in temperature produced during the pressure molding using a press machine, the copper plate 4x and the semiconductor substrate 1 become thermally expanded. As described previously, since the bump 4a is formed at the position displaced by a distance in accordance with a difference in the coefficients of linear expansion of the copper plate 4x and the semiconductor substrate 1, a heating temperature, and a distance from the reference point which is not moved during the heating, the bump 4a is moved to face the electrode 2a due to the thermal expansion during the pressure molding using a press machine. Thus, the accuracy of the alignment of the bump 4a and the electrode 2a can be improved; and as a result, the connection reliability between the bump 4a and the electrode 2a is further improved. Since the trench 4b is also formed at the position displaced by the same distance as in the bump 4a, the trench 4b is moved to the position in association with the rewiring pattern 4 due to the thermal expansion.

The subsequent formation of the rewiring pattern 4, the formation of the external connection electrode (solder ball) 9, and the singulation of the semiconductor substrate 1 are as described in the embodiment 1; and thus, the description thereof is omitted.

According to the method of manufacturing the semiconductor module of the embodiment, the following advantages are provided in addition to the above mentioned advantages (1)-(8) of the embodiment 1.

(9) The bump 4a is formed at the position displaced in a direction opposite to the expansion of the copper plate 4x from the position where the bump 4a faces the electrode 2a by a distance in accordance with a difference in the coefficients of linear expansion of the copper plate 4x and the semiconductor substrate 1, a heating temperature during the pressure-bonding, and a distance from the reference point of the copper plate 4x which is not moved by the expansion caused due to the heating. As a result, in the pressure-bonding of the bump 4a of the copper plate 4x and the electrode 2a of the semiconductor substrate 1, the semiconductor module, having the bump 4a and the electrode 2a aligned with high accuracy, can be manufactured; and thus, the connection reliability of the semiconductor module can be further improved.

Embodiment 3

A description will now be given of the mobile device provided with the semiconductor module according to the embodiments of the present invention. While a cell phone is described to exemplify mobile devices, the inventive module may also be applied to electronic devices such as personal digital assistants (PDA), digital video cameras (DVC) and digital still cameras (DSC).

Figure 12:
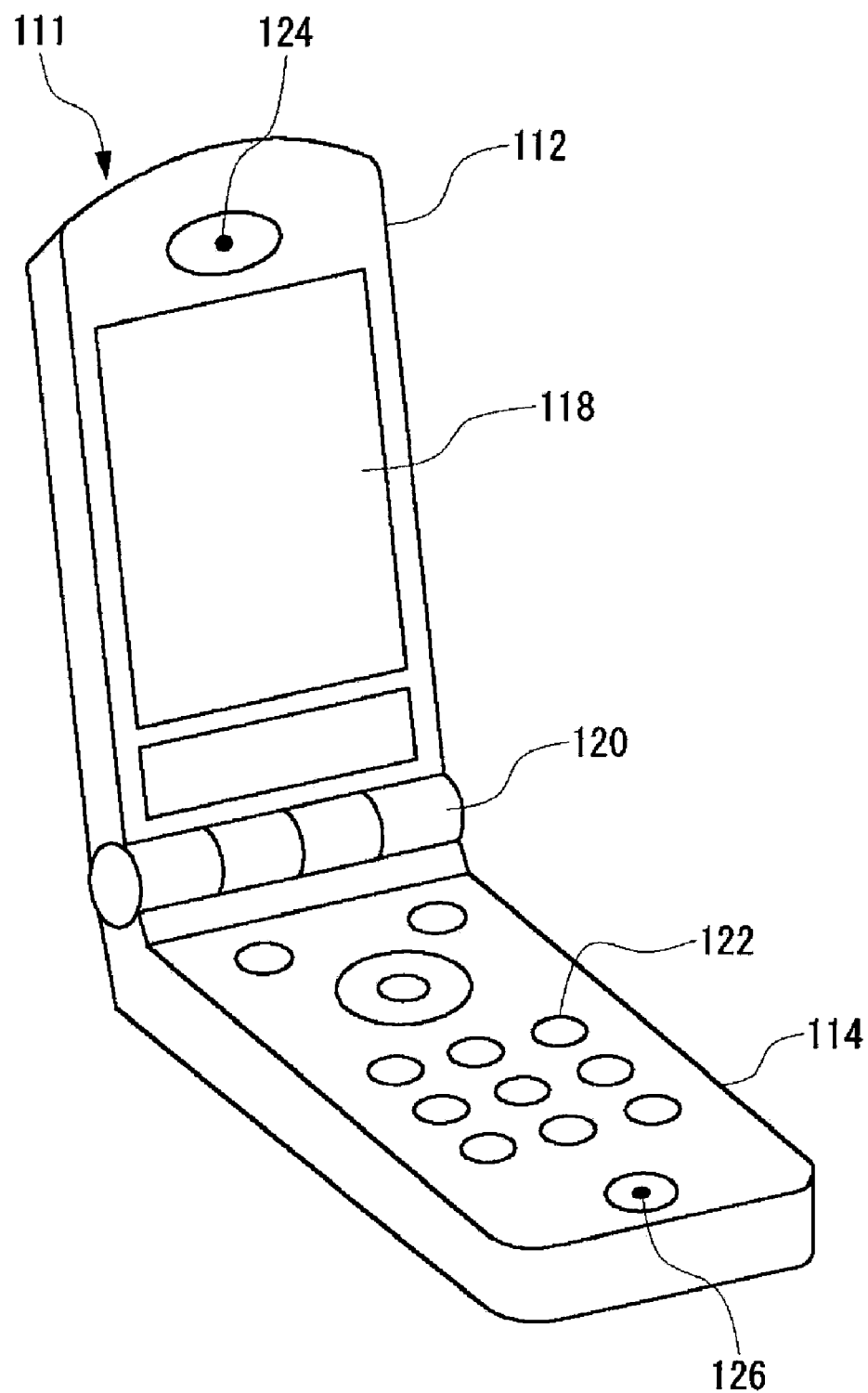
FIG. 12 is a view illustrating structure of a cell phone according to the embodiment 3.

FIG. 12 shows the structure of a cell phone provided with the semiconductor module according to the embodiment of the present invention. A cell phone 111 is structured such that a first housing 112 and a second housing 114 are connected via a movable unit 120. The first housing 112 and the second housing 114 are movable around the movable unit 120. The first housing 112 is provided with a display unit 118 for displaying information including characters and images, and with a speaker unit 124. The second housing 114 is provided with a control 122 (e.g., control buttons) and a microphone unit 126. The semiconductor module according to the embodiments is mounted inside the cell phone 111.

Figure 13:
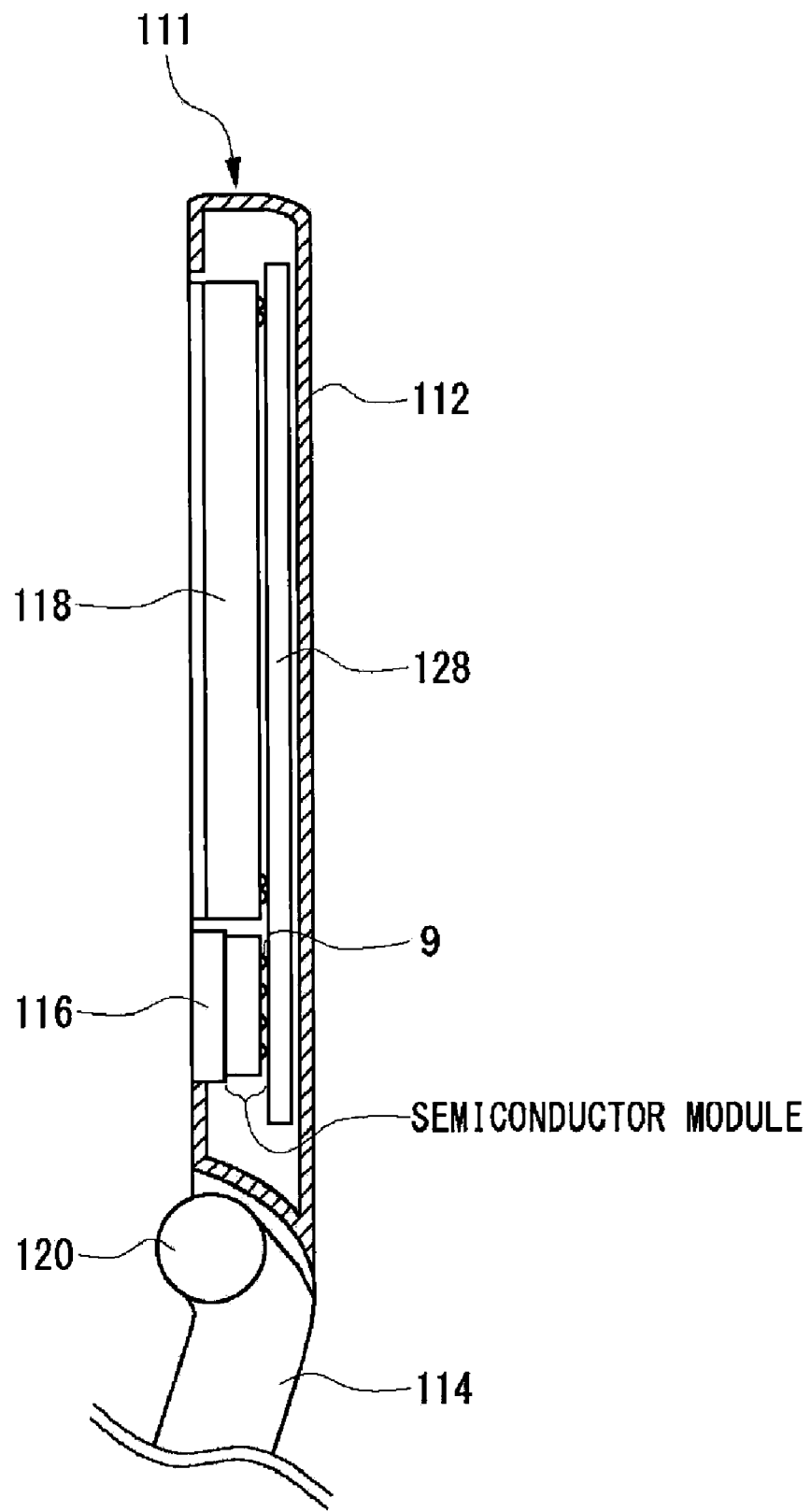
FIG. 13 is a partial sectional view of a cell phone.

FIG. 13 is a partial section of the cell phone shown in FIG. 12 (section of the first housing 112). The semiconductor module according to the embodiments is mounted on a printed board 128 via an external connection electrode (solder ball) 9, and electrically connected to, for example, the display unit 118 via the printed board 128. The underside of the semiconductor module (the surface opposite to the electrode 9) is provided with a heat spreader 116 such as a metal plate. For example, heat generated by the semiconductor module is prevented from being collected inside the first housing 112 and is released outside the first housing 112 efficiently.

According to the mobile device provided with the semiconductor module according to the embodiment, the following advantages are provided.

(10) Since the accuracy of the alignment of the bump 4a and the electrode 2a and the connection reliability of the semiconductor module are improved, the reliability of the mobile device carrying the semiconductor module is improved.

(11) Since the cost of manufacturing the semiconductor module is reduced, the cost of manufacturing the mobile device carrying the semiconductor module is reduced accordingly.

These embodiments are intended to be illustrative only and it will be obvious to those skilled in the art that various modifications could be developed based on the knowledge of a skilled person and that such modifications are also within the scope of the present invention.

In the above-described embodiments, the alignment pattern unit 7b and the corresponding alignment pattern unit 7a are provided in the scribe line 5 by way of example. Alternatively, the alignment patterns may be provided in the semiconductor module forming region 6. The aforementioned advantages other than (5) are enjoyed with such a structure.

In the above-described embodiments, the formation of the bump 4a of the copper plate 4x being progressively smaller in diameter toward the end part unit 4a1 is provided by way of example. Alternatively, the bump 4a may be of cylindrical shape having a predetermined diameter. While the round bump 4a is used in the embodiment, the bump may have a polygonal (e.g., square) shape. The aforementioned advantages are equally enjoyed with such a structure.

In the above-described embodiments, in order to secure a large gap between the electrodes 2a of the semiconductor substrate 1 (semiconductor device 2), the rewiring pattern 4 is formed by embedding the bump 4a in the insulating layer 8 so as to laminate the copper plate 4x, the insulating layer 8, and the semiconductor device 2, and the underside of the rewiring pattern 4 is provided with the electrode for the external connection (solder ball) 9 by way of example. Alternatively, a wiring layer may be formed repeatedly using a copper plate having a bump and a trench so as to form a multi-layer structure. With this, a multi-layer interconnection with improved accuracy of aligning a wiring layer and a bump corresponding to a via contact can be manufactured.

What is claimed is:

1. A method of manufacturing a semiconductor module, the method comprising:
   1) preparing a substrate having a semiconductor device, an electrode connected electrically to the semiconductor device, and a predetermined first pattern unit on its surface;
   2) preparing a metal plate provided with a first principle surface, having a bump integrally formed with the metal plate and projecting from the first principle surface, and a second principle surface, opposite to the first principle surface, having a trench having a predetermined pattern corresponding to the first pattern unit;
   3) aligning the bump and the electrode by adjusting a position of the metal plate so that the first pattern unit and the corresponding trench have a predetermined positional relation, pressure-bonding the first principle surface of the metal plate and the substrate through the insulating layer, and connecting the bump and the electrode electrically while the bump penetrates an insulating layer; and
   4) forming a wiring layer having a predetermined pattern on the second principle surface of the metal plate.

2. The method of manufacturing a semiconductor module according to claim 1, wherein the metal plate is processed into the wiring layer having a predetermined pattern by performing etch-back on the second principle surface of the metal plate so that a bottom part of the trench is penetrated to reach the first principle surface in step 4).

3. The method of manufacturing a semiconductor module according to claim 2, wherein the metal plate is processed so that a region between sides of the wiring layer and the second principle surface of the wiring layer are chamfered in step 4).

4. The method of manufacturing a semiconductor module according to claim 1, wherein step 2) further comprises:
   process 1) of forming the bump on one side of the metal plate, wherein the metal plate is flat; and
   process 2) of forming the trench on the other side of the flat metal plate using a second predetermined pattern unit of the bump as a reference.

5. The method of manufacturing a semiconductor module according to claim 1, wherein there are a plurality of semiconductor devices formed on the substrate, and
   the trench is further formed in a scribe region formed to define the plurality of semiconductor devices.

6. The method of manufacturing a semiconductor module according to claim 4, wherein,
   step 3) comprises pressure-bonding the first principle surface of the metal plate and the substrate while adding heat, and
   process 1) comprises forming the bump at a position displaced in a direction opposite to the expansion of the metal plate from a position where the bump faces the electrode in accordance with a difference in the coefficients of thermal expansion of the metal plate and the substrate, a heating temperature in step 3), and a distance from a reference point of the metal plate which is not moved by the expansion caused due to the heating in step 3).

7. A semiconductor module comprising:
   a wiring layer having a bump integrally formed with the wiring layer and on a first principle surface of the wiring layer;
   a substrate having on its surface a semiconductor device and an electrode connected electrically to the semiconductor device and positioned so as to correspond to the bump; and an insulating layer provided between the wiring layer and the substrate, wherein, the bump and the electrode are connected electrically while the bump is penetrating through the insulating layer, and the region between the sides of the wiring layer and a second principle surface of the wiring layer are chamfered, wherein the second principle surface is opposite the first principle surface and further away from the insulating layer than the first principle surface.

8. A mobile device in which the semiconductor module of claim 7 is mounted.

9. The method of manufacturing a semiconductor module according to claim 3, wherein the second principle surface is further from the insulating layer than the first principle surface.

10. The semiconductor module according to claim 7, wherein the second principle surface is further from the insulating layer than the first principle surface.

11. The method of manufacturing a semiconductor module according to claim 1, wherein the bump is seamlessly and contiguously formed with the wiring layer.

12. The semiconductor module according to claim 7, wherein the bump is seamlessly and contiguously formed with the wiring layer.

* * * * *